(12) United States Patent
Happ et al.

(10) Patent No.: US 7,745,812 B2
(45) Date of Patent: Jun. 29, 2010

(54) INTEGRATED CIRCUIT INCLUDING VERTICAL DIODE

(75) Inventors: Thomas Happ, Tarrytown, NY (US); Jan Boris Philipp, Peekskill, NY (US)

(73) Assignee: Qimonda North America Corp., Cary, NC (US)

( * ) Notice: Subject to any disclaimer, the term of this patent is extended or adjusted under 35 U.S.C. 154(b) by 341 days.

(21) Appl. No.: 11/766,231

(22) Filed: Jun. 21, 2007

(65) Prior Publication Data

US 2008/0315172 A1 Dec. 25, 2008

(51) Int. Cl.
 *H01L 47/00* (2006.01)
(52) U.S. Cl. .................. 257/4; 257/589; 257/E29.139
(58) Field of Classification Search .............. 257/537, 257/246, 42, E29.029, 4
 See application file for complete search history.

(56) References Cited

U.S. PATENT DOCUMENTS

| | | | |
|---|---|---|---|
| 6,838,692 B1 | 1/2005 | Lung | |
| 6,969,633 B2 | 11/2005 | Dennison | |
| 6,995,446 B2 | 2/2006 | Karpov et al. | |
| 2003/0001230 A1 | 1/2003 | Lowrey | |
| 2005/0128785 A1 | 6/2005 | Kang | |
| 2005/0194620 A1* | 9/2005 | Dennison et al. ............ 257/246 |
| 2006/0034116 A1 | 2/2006 | Lam et al. | |
| 2006/0151771 A1 | 7/2006 | Asano et al. | |
| 2006/0186483 A1 | 8/2006 | Cho et al. | |
| 2006/0284237 A1 | 12/2006 | Park et al. | |

OTHER PUBLICATIONS

"Full Integration of Highly Manufacturable 512Mb PRAM based on 90nm Technology", J. H. Oh, et al., IEEE, 2006 (1 pg.).
"Highly Reliable 50 nm Contact Cell Technology for 256Mb PRAM", S. J. Ahn, et al., Samsung Electronics Co., Ltd, (2 pgs.).
"Ovonic Unified Memory—A High-performance Nonvolatile Memory Technology for Stand Alone Memory and Embedded Applications", Manzur Gill, et al., Intel Corporation (4 pgs.).

* cited by examiner

*Primary Examiner*—Jerome Jackson, Jr.
*Assistant Examiner*—Dale Page
(74) *Attorney, Agent, or Firm*—Dicke, Billig & Czaja, PLLC

(57) ABSTRACT

An integrated circuit includes a vertical diode defined by crossed line lithography.

22 Claims, 16 Drawing Sheets

INTEGRATED CIRCUIT INCLUDING VERTICAL DIODE

CROSS-REFERENCE TO RELATED APPLICATIONS

This application is related to U.S. patent application Ser. No. 11/766,290, entitled "INTEGRATED CIRCUIT INCLUDING VERTICAL DIODE," filed on the same date as the present application, which is incorporated herein by reference.

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state and from the crystalline state to the amorphous state in response to temperature changes. The temperature changes of the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

Higher density phase change memories can also be achieved by reducing the physical size of each memory cell. Increasing the density of a phase change memory increases the amount of data that can be stored within the memory while at the same time typically reducing the cost of the memory.

For these and other reasons, there is a need for the present invention.

SUMMARY

One embodiment provides an integrated circuit. The integrated circuit includes a vertical diode defined by crossed line lithography.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
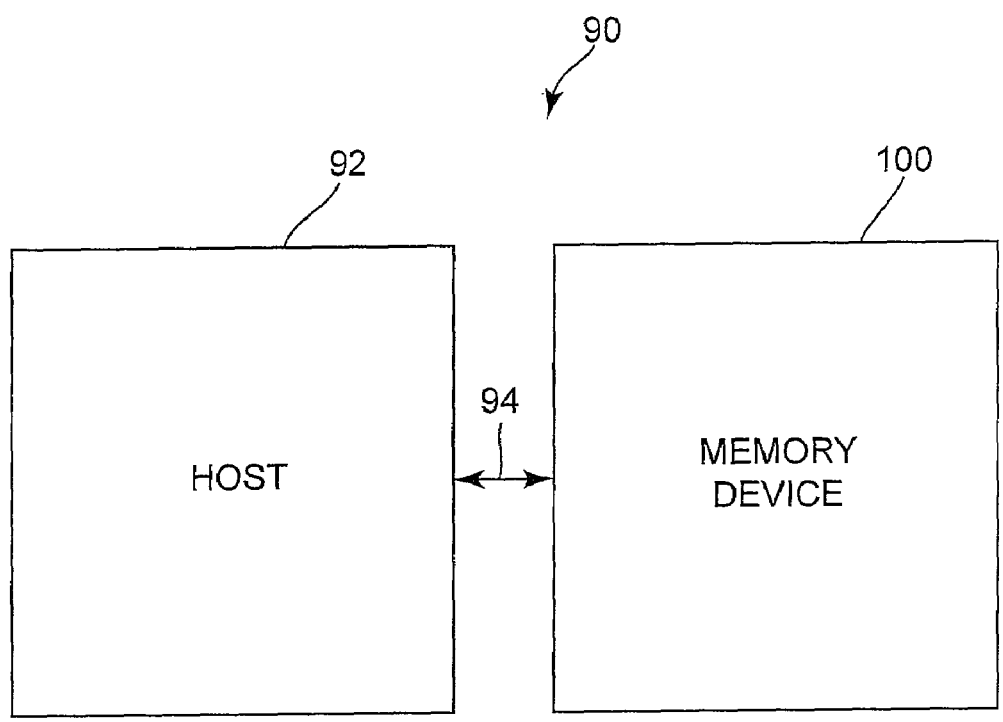
FIG. 1 is a block diagram illustrating one embodiment of a system.

FIG. 1 is block diagram illustrating one embodiment of a system 90. System 90 includes a host 92 and a memory device 100. Host 92 is communicatively coupled to memory device 100 through communication link 94. Host 92 includes a computer (e.g., desktop, laptop, handheld), portable electronic device (e.g., cellular phone, personal digital assistant (PDA), MP3 player, video player), or any other suitable device that uses memory. Memory device 100 provides memory for host 92. In one embodiment, memory device 100 includes a phase change memory device or other suitable resistive or resistivity changing memory device.

Figure 2:
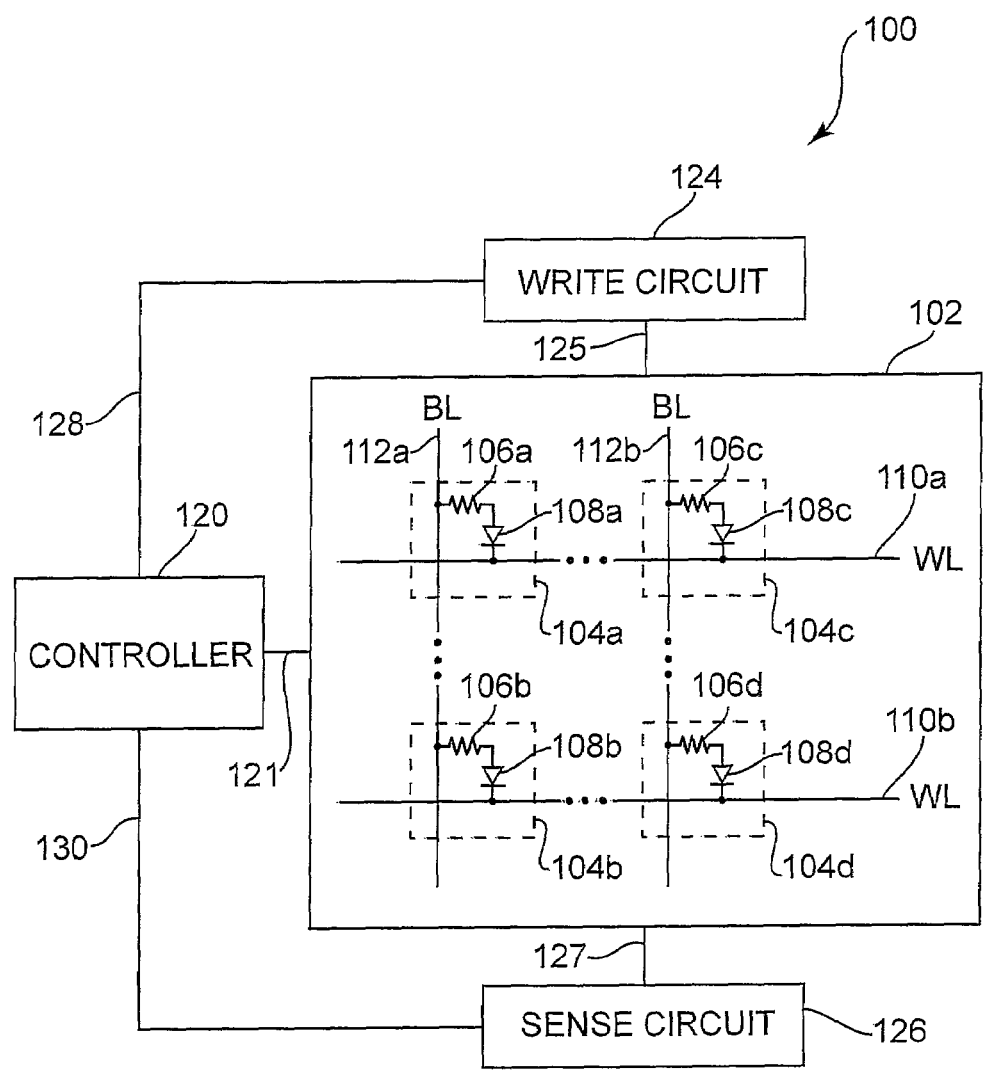
FIG. 2 is a diagram illustrating one embodiment of a memory device.

FIG. 2 is a diagram illustrating one embodiment of memory device 100. Memory device 100 includes a write circuit 124, a controller 120, a memory array 102, and a sense circuit 126. Memory array 102 includes a plurality of resistive memory cells 104a-104d (collectively referred to as resistive memory cells 104), a plurality of bit lines (BLs) 112a-112b (collectively referred to as bit lines 112), and a plurality of word lines (WLs) 110a-110b (collectively referred to as word lines 110). In one embodiment, resistive memory cells 104 are phase change memory cells. In other embodiments, resistive memory cells 104 are another suitable type of resistive memory cells or resistivity changing memory cells.

Each memory cell 104 includes a phase change element 106 and a diode 108. By using diodes 108 to access bits within memory array 102, a $4F^2$ memory cell size is achieved, where "F" is the minimum lithographic feature size. Memory cells 104 are fabricated using crossed line lithography. Spacers formed on sidewalls of an electrode are used to define self-aligned vertical diodes 108 for accessing phase change elements 106.

As used herein, the term "electrically coupled" is not meant to mean that the elements must be directly coupled together and intervening elements may be provided between the "electrically coupled" elements.

Memory array 102 is electrically coupled to write circuit 124 through signal path 125, to controller 120 through signal path 121, and to sense circuit 126 through signal path 127. Controller 120 is electrically coupled to write circuit 124 through signal path 128 and to sense circuit 126 through signal path 130. Each phase change memory cell 104 is electrically coupled to a word line 110 and a bit line 112. Phase change memory cell 104a is electrically coupled to bit line 112a and word line 110a, and phase change memory cell 104b is electrically coupled to bit line 112a and word line 110b. Phase change memory cell 104c is electrically coupled to bit line 112b and word line 110a, and phase change memory cell 104d is electrically coupled to bit line 112b and word line 110b.

Each phase change memory cell 104 includes a phase change element 106 and a diode 108. Phase change memory cell 104a includes phase change element 106a and diode 108a. One side of phase change element 106a is electrically coupled to bit line 112a, and the other side of phase change element 106a is electrically coupled to one side of diode 108a. The other side of diode 108a is electrically coupled to word line 110a. In another embodiment, the polarity of diode 108a is reversed.

Phase change memory cell 104b includes phase change element 106b and diode 108b. One side of phase change element 106b is electrically coupled to bit line 112a, and the other side of phase change element 106b is electrically coupled to one side of diode 108b. The other side of diode 108b is electrically coupled to word line 110b.

Phase change memory cell 104c includes phase change element 106c and diode 108c. One side of phase change element 106c is electrically coupled to bit line 112b and the other side of phase change element 106c is electrically coupled to one side of diode 108c. The other side of diode 108c is electrically coupled to word line 110a.

Phase change memory cell 104d includes phase change element 106d and diode 108d. One side of phase change element 106d is electrically coupled to bit line 112b and the other side of phase change element 106d is electrically coupled to one side of diode 108d. The other side of diode 108d is electrically coupled to word line 110b.

In another embodiment, each phase change element 106 is electrically coupled to a word line 110 and each diode 108 is electrically coupled to a bit line 112. For example, for phase change memory cell 104a, one side of phase change element 106a is electrically coupled to word line 110a. The other side of phase change element 106a is electrically coupled to one side of diode 108a. The other side of diode 108a is electrically coupled to bit line 112a.

In one embodiment, each resistive memory element 106 is a phase change element that comprises a phase change material that may be made up of a variety of materials in accordance with the present invention. Generally, chalcogenide alloys that contain one or more elements from Group VI of the periodic table are useful as such materials. In one embodiment, the phase change material is made up of a chalcogenide compound material, such as GeSbTe, SbTe, GeTe, or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S. The phase change material can be undoped or doped with other suitable elements or combinations of elements, such as N or $SiO_2$.

Each phase change element may be changed from an amorphous state to a crystalline state or from a crystalline state to an amorphous state under the influence of temperature change. The amount of crystalline material coexisting with amorphous material in the phase change material of one of the phase change elements thereby defines two or more states for storing data within memory device 100. In the amorphous state, a phase change material exhibits significantly higher resistivity than in the crystalline state. Therefore, the two or more states of the phase change elements differ in their electrical resistivity. In one embodiment, the two or more states are two states and a binary system is used, wherein the two states are assigned bit values of "0" and "1". In another embodiment, the two or more states are three states and a ternary system is used, wherein the three states are assigned bit values of "0", "1", and "2". In another embodiment, the two or more states are four states that are assigned multi-bit values, such as "00", "01", "10", and "11". In other embodiments, the two or more states can be any suitable number of states in the phase change material of a phase change element.

Controller 120 includes a microprocessor, microcontroller, or other suitable logic circuitry for controlling the operation of memory device 100. Controller 120 controls read and write operations of memory device 100 including the application of control and data signals to memory array 102 through write circuit 124 and sense circuit 126. In one embodiment, write circuit 124 provides voltage pulses through signal path 125 and bit lines 112 to memory cells 104 to program the memory cells. In other embodiments, write circuit 124 provides current pulses through signal path 125 and bit lines 112 to memory cells 104 to program the memory cells.

Sense circuit 126 reads each of the two or more states of memory cells 104 through bit lines 112 and signal path 127. In one embodiment, to read the resistance of one of the memory cells 104, sense circuit 126 provides current that flows through one of the memory cells 104. Sense circuit 126 then reads the voltage across that one of the memory cells 104. In another embodiment, sense circuit 126 provides voltage across one of the memory cells 104 and reads the current that flows through that one of the memory cells 104. In another embodiment, write circuit 124 provides voltage across one of the memory cells 104 and sense circuit 126 reads the current that flows through that one of the memory cells 104. In another embodiment, write circuit 124 provides current that flows through one of the memory cells 104 and sense circuit 126 reads the voltage across that one of the memory cells 104.

In one embodiment, during a "set" operation of phase change memory cell 104a, a set current or voltage pulse is selectively enabled by write circuit 124 and sent through bit line 112a to phase change element 106a thereby heating phase change element 106a above its crystallization temperature (but usually below its melting temperature). In this way, phase change element 106a reaches its crystalline state or a partially crystalline and partially amorphous state during this set operation.

During a "reset" operation of phase change memory cell 104a, a reset current or voltage pulse is selectively enabled by write circuit 124 and sent through bit line 112a to phase change element 106a. The reset current or voltage quickly heats phase change element 106a above its melting temperature. After the current or voltage pulse is turned off, phase change element 106a quickly quench cools into the amorphous state or a partially amorphous and partially crystalline state.

Phase change memory cells 104b-104d and other phase change memory cells 104 in memory array 102 are set and reset similarly to phase change memory cell 104a using a similar current or voltage pulse. In other embodiments, for other types of resistive memory cells, write circuit 124 provides suitable programming pulses to program the resistive memory cells 104 to the desired state.

Figure 3:
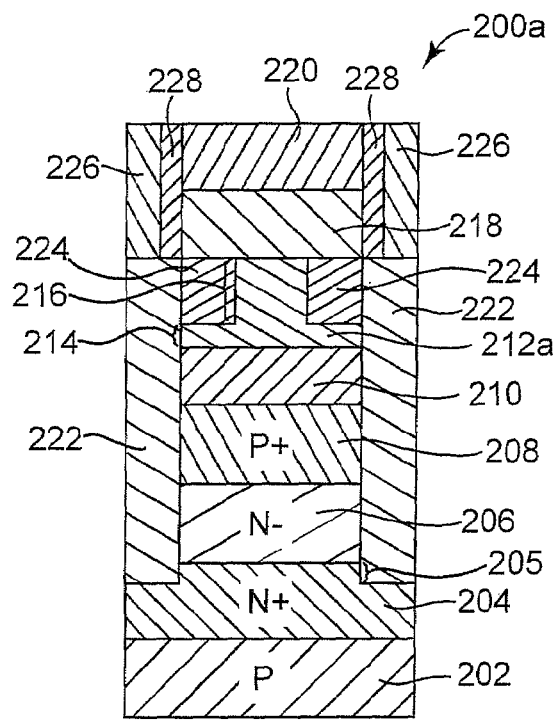
FIG. 3 illustrates a cross-sectional view of one embodiment of a memory cell.

FIG. 3 illustrates a cross-sectional view of one embodiment of a memory cell 200a. In one embodiment, each memory cell 104 is similar to memory cell 200a. In one embodiment, memory cell 200a is a mushroom memory cell. Memory cell 200a includes a P substrate 202, an N+ word line 204, an N− region 206, a P+ region 208, a silicide contact 210, a bottom electrode 212a, a phase change element 218, a top electrode 220, spacers 224, dielectric material 222, encapsulation material 228, and dielectric material 226. P+ region 208 and N− region 206 form a diode 108. In another embodiment, the doping of regions 204, 206, and 208 are inverted, such that the polarity of diode 108 is reversed. Bottom electrode 212a includes a first portion 214 and a second portion 216. First portion 214 has a greater cross-sectional width than second portion 216.

Word line 204 includes an N+ region formed using epitaxy, ion implantation into the P substrate, or a combination of epitaxy and ion implantation. The top of word line 204 contacts the bottom of N− region 206. N− region 206 is formed using epitaxy, ion implantation into the P substrate, or a combination of epitaxy and ion implantation. The top of N− region 206 contacts the bottom of P+ region 208. P+ region 208 is formed using epitaxy, ion implantation into the P substrate, or a combination of epitaxy and ion implantation. The top of P+ region 208 contacts the bottom of silicide contact 210. Silicide contact 210 includes CoSi, TiSi, NiSi, NiPtSi, $WSi_x$, TaSi, or other suitable silicide.

The top of silicide contact 210 contacts the bottom of first portion 214 of bottom electrode 212a. Bottom electrode 212a includes TiN, TaN, W, Al, Ti, Ta, TiSiN, TaSiN, TiAlN, TaAlN, Cu, WN, C, or other suitable electrode material. Second portion 216 of bottom electrode 212a is laterally surrounded by spacers 224. Spacers 224 include SiN, $SiO_2$, $SiO_xN$, or other suitable spacer material. Sidewalls of spacers 224 are self-aligned with sidewalls of first portion 214 of bottom electrode 212a, the sidewalls of silicide contact 210, the sidewalls of P+ region 208, and the sidewalls of N− region 206.

The top of second portion 216 of bottom electrode 212a contacts the bottom of phase change element 218. Phase change element 218 provides a storage location for storing one or more bits of data. The active or phase change region of phase change element 218 is at the interface between phase change element 218 and bottom electrode 212a. The top of phase change element 218 contacts the bottom of top electrode 220. Top electrode 220 includes TiN, TaN, W, Al, Ti, Ta, TiSiN, TaSiN, TIAlN, Cu, WN, C, or other suitable electrode material.

Dielectric material 222 laterally surrounds N− region 206, P+ region 208, silicide contact 210, bottom electrode 212a, and spacers 224. In one embodiment, dielectric material 222 extends slightly into N+ word line 204 as indicated at 205. Dielectric material 222 includes $SiO_2$, $SiO_x$, SiN, fluorinated silica glass (FSG), boro-phosphorous silicate glass (BPSG), boro-silicate glass (BSG), or other suitable dielectric material. Encapsulation material 228 laterally surrounds phase change element 218 and top electrode 220. Encapsulation material 228 includes SiN, SiON, or other suitable encapsulation material. In one embodiment, more than one layer of encapsulation material laterally surrounds phase change element 218 and top electrode 220. In one embodiment, encapsulation material 228 contacts a portion of the top of top electrode 220. Dielectric material 226 laterally surrounds encapsulation material 228. Dielectric material 226 includes $SiO_2$, $SiO_x$, SiN, FSG, BPSG, BSG, or other suitable dielectric material.

The current path through memory cell 200a is from top electrode 220 through phase change element 218 to bottom electrode 212a. From bottom electrode 212a, the current flows through silicide contact 210 and the diode formed by P+ region 208 and N− region 206. From N− region 206 the current flows through N+ word line 204. The cross-sectional width of the interface area between phase change element 218 and bottom electrode 212a defines the current density through the interface and thus the power needed to program memory cell 200a. By reducing the cross-sectional width of the interface area, the current density is increased, thus reducing the power used to program memory cell 200a.

During operation of memory cell 200a, current or voltage pulses are applied between top electrode 220 and word line 204 to program memory cell 200a. During a set operation of memory cell 200a, a set current or voltage pulse is selectively enabled by write circuit 124 and sent through a bit line to top electrode 220. From top electrode 220, the set current or voltage pulse passes through phase change element 218 thereby heating the phase change material above its crystallization temperature (but usually below its melting temperature). In this way, the phase change material reaches a crystalline state or a partially crystalline and partially amorphous state during the set operation.

During a reset operation of memory cell 200a, a reset current or voltage pulse is selectively enabled by write circuit 124 and sent through a bit line to top electrode 220. From top electrode 220, the reset current or voltage pulse passes through phase change element 218. The reset current or voltage quickly heats the phase change material above its melting temperature. After the current or voltage pulse is turned off, the phase change material quickly quench cools into an amorphous state or a partially amorphous and partially crystalline state.

Figure 4:
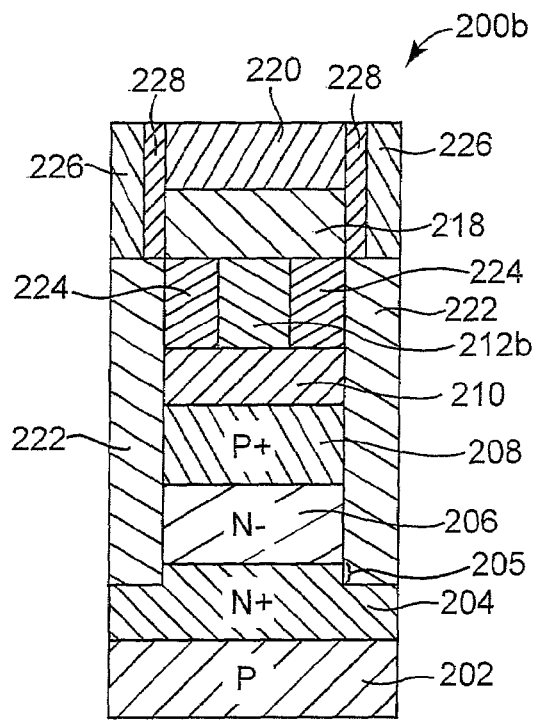
FIG. 4 illustrates a cross-sectional view of another embodiment of a memory cell.

FIG. 4 illustrates a cross-sectional view of another embodiment of a memory cell 200b. In one embodiment, each memory cell 104 is similar to memory cell 200b. Memory cell 200b is similar to memory cell 200a previously described and illustrated with reference to FIG. 3, except that in memory cell 200b, bottom electrode 212a is replaced with bottom electrode 212b.

In this embodiment, bottom electrode 212b is laterally surrounded by spacers 224. The top of silicide contact 210 contacts the bottom of spacers 224 and the bottom of bottom electrode 212b. Memory cell 200b is programmed similarly to memory cell 200a previously described and illustrated with reference to FIG. 3.

Figure 5:
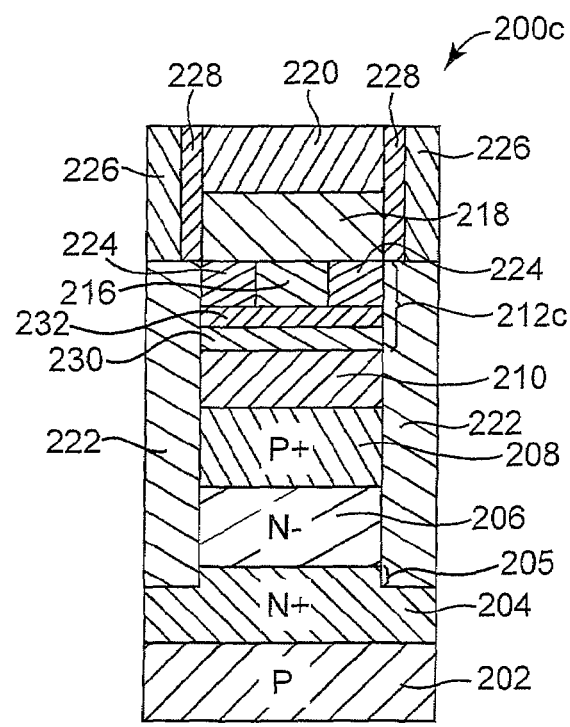
FIG. 5 illustrates a cross-sectional view of another embodiment of a memory cell.

FIG. 5 illustrates a cross-sectional view of another embodiment of a memory cell 200c. In one embodiment, each memory cell 104 is similar to memory cell 200c. Memory cell 200c is similar to memory cell 200a previously described and illustrated with reference to FIG. 3, except that in memory cell 200c, bottom electrode 212a is replaced with bottom electrode 212c.

In this embodiment, bottom electrode 212c includes a first portion 230, a second portion 232, and a third portion 216. First portion 230 and second portion 232 have the same cross-sectional width. First portion 230 and second portion 232 have a greater cross-sectional width than third portion 216. First portion 230 and third portion 216 include the same electrode material. Second portion 232 includes an etch stop material.

The top of silicide contact 210 contacts the bottom of first portion 230. The top of first portion 230 contacts the bottom of second portion 232. The top of second portion 232 contacts the bottom of spacers 224 and the bottom of third portion 216. Etch stop second portion 232 provides an etch endpoint for the etching of the electrode material layer used to fabricate third portion 216 of bottom electrode 212c during the fabrication process of memory cell 200c. Memory cell 200c is programmed similarly to memory cell 200a previously described and illustrated with reference to FIG. 3.

Figure 6:
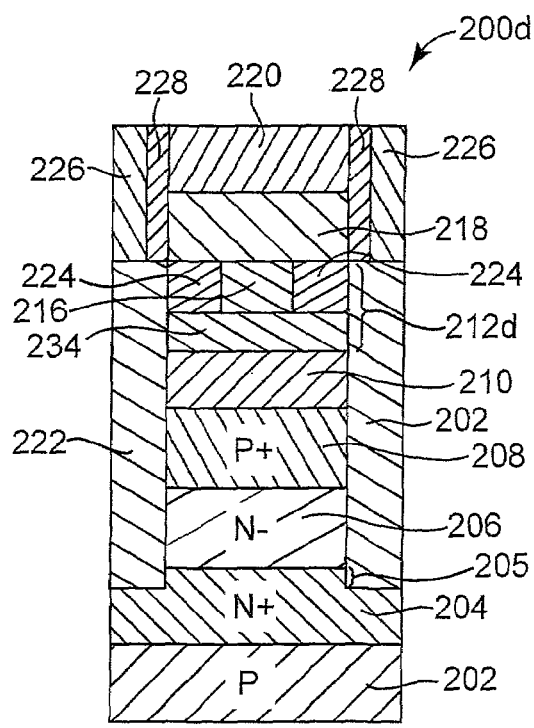
FIG. 6 illustrates a cross-sectional view of another embodiment of a memory cell.

FIG. 6 illustrates a cross-sectional view of another embodiment of a memory cell 200d. In one embodiment, each memory cell 104 is similar to memory cell 200d. Memory cell 200d is similar to memory cell 200a previously described and illustrated with reference to FIG. 3, except that in memory cell 200d bottom electrode 212a is replaced with bottom electrode 212d.

In this embodiment, bottom electrode 212d includes a first portion 234 and a second portion 216. First portion 234 has a greater cross-sectional width than second portion 216. First portion 234 includes a first electrode material and second portion 216 includes a second electrode material different than the first electrode material. The top of silicide contact 210 contacts the bottom of first portion 234. The top of first portion 234 contacts the bottom of spacers 224 and the bottom of second portion 216. First portion 234 provides an etch endpoint for the etching of the electrode material layer used to fabricate second portion 216 of bottom electrode 212d during the fabrication process of memory cell 200d. In addition, by selecting electrode materials having different resistivities for first portion 234 and second portion 216, the heat generation within bottom electrode 212d is optimized. Memory cell 200d is programmed similarly to memory cell 200a previously described and illustrated with reference to FIG. 3.

Figure 7:
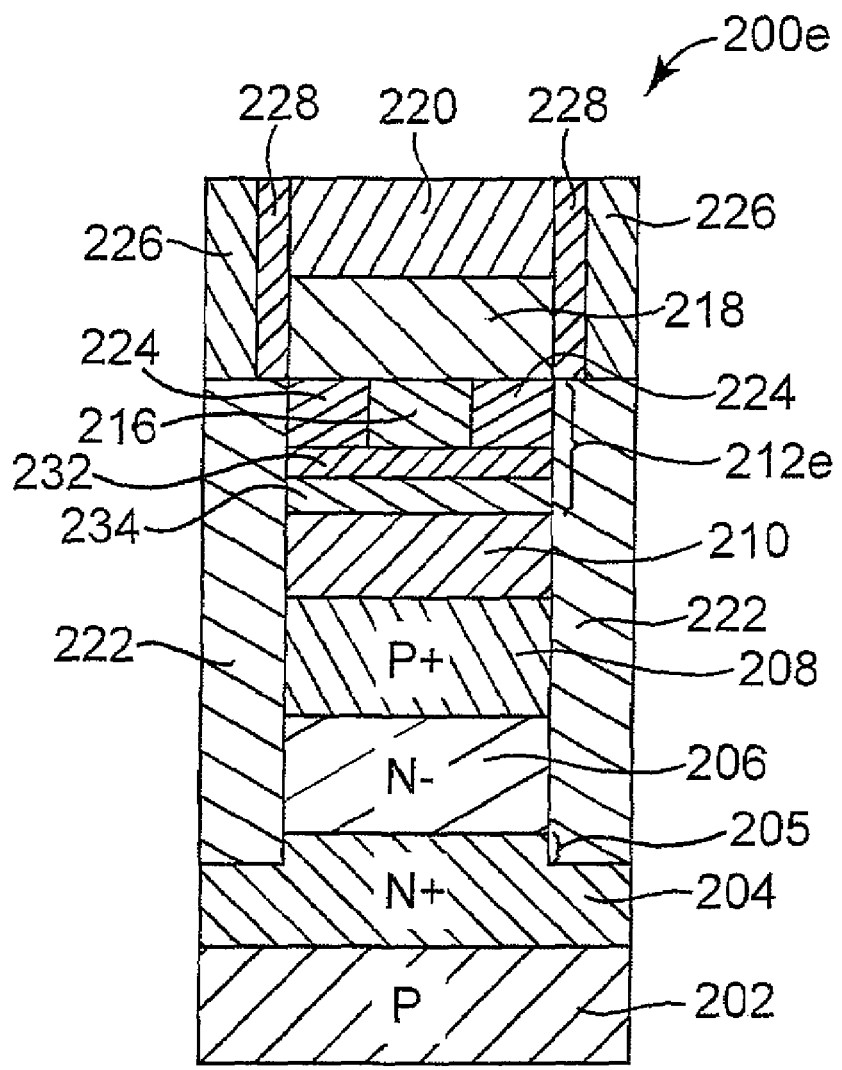
FIG. 7 illustrates a cross-sectional view of another embodiment of a memory cell.

FIG. 7 illustrates a cross-sectional view of another embodiment of a memory cell 200e. In one embodiment, each memory cell 104 is similar to memory cell 200e. Memory cell 200e is similar to memory cell 200a previously described and illustrated with reference to FIG. 3, except that in memory cell 200e bottom electrode 212a is replaced with bottom electrode 212e.

In this embodiment, bottom electrode 212e includes a first portion 234, a second portion 232, and a third portion 216. First portion 234 and second portion 232 have the same cross-sectional width. First portion 234 and second portion 232 have a greater cross-sectional width than third portion 216. First portion 234 and third portion 216 include different electrode materials. Second portion 232 includes an etch stop material.

The top of silicide contact 210 contacts the bottom of first portion 234. The top of first portion 234 contacts the bottom of second portion 232. The top of second portion 232 contacts the bottom of spacers 224 and the bottom of third portion 216. Etch stop second portion 232 provides an etch endpoint for the etching of the electrode material layer used to fabricate third portion 216 of bottom electrode 212e during the fabrication process of memory cell 200e. In addition, by selecting electrode materials having different resistivities for first portion 234 and third portion 216, the heat generation within bottom electrode 212e is optimized. Memory cell 200e is programmed similarly to memory cell 200a previously described and illustrated with reference to FIG. 3.

The following FIGS. 8-26 illustrate embodiments for fabricating memory cells 200a-200e previously described and illustrated with reference to FIGS. 3-7.

Figure 8:
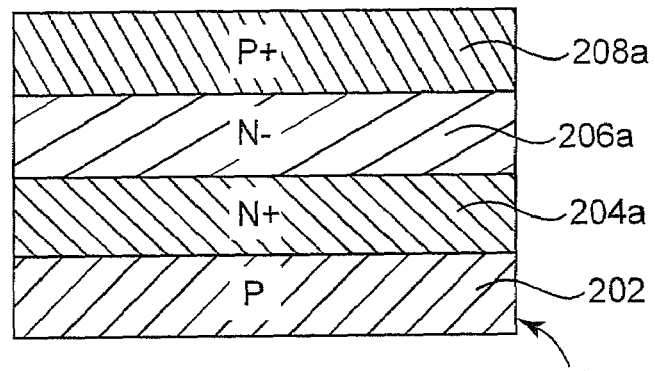
FIG. 8 illustrates a cross-sectional view of one embodiment of a wafer after forming an N+ region layer, an N– region layer, and a P+ region layer.

FIG. 8 illustrates a cross-sectional view of one embodiment of a wafer 240 after forming an N+ region layer 204a, an N− region layer 206a, and a P+ region layer 208a. In one embodiment, logic transistors are formed in the periphery of the memory array before the diodes are formed in the memory array. In another embodiment, the diodes are formed in the memory array before the logic transistors are formed in the periphery of the memory array. The following description focuses solely on the memory array portion of the integrated circuit.

In one embodiment, a P substrate 202 is implanted with an N implant to form N+ region layer 204a. In one embodiment, N− region layer 206a is formed over N+ region layer 204a using epitaxy, and P+ region layer 208a is formed over N− region layer 206a using epitaxy. In another embodiment, N− region layer 206a and P+ region layer 208a are formed using ion implantation into P substrate 202. In another embodiment, a combination of epitaxy and ion implantation is used to provide N− region layer 206a and P+ region layer 208a.

Figure 9:
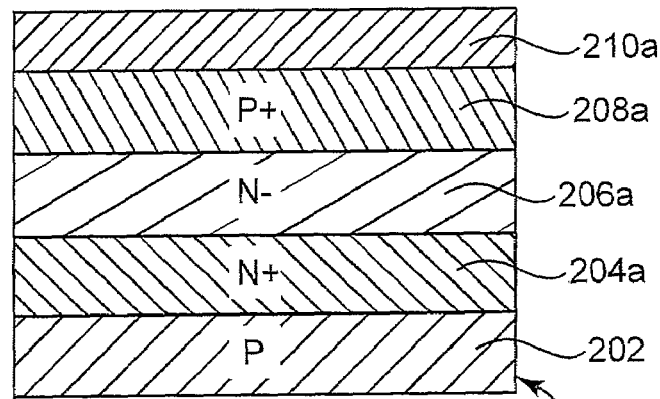
FIG. 9 illustrates a cross-sectional view of one embodiment of the wafer after forming a silicide layer.

FIG. 9 illustrates a cross-sectional view of one embodiment of wafer 240 after forming a silicide layer 210a. Silicide, such as CoSi, TiSi, NiSi, NiPtSi, WSi, TaSi, or other suitable silicide is formed over P+ region layer 208a to provide silicide layer 210a.

Figure 10A:
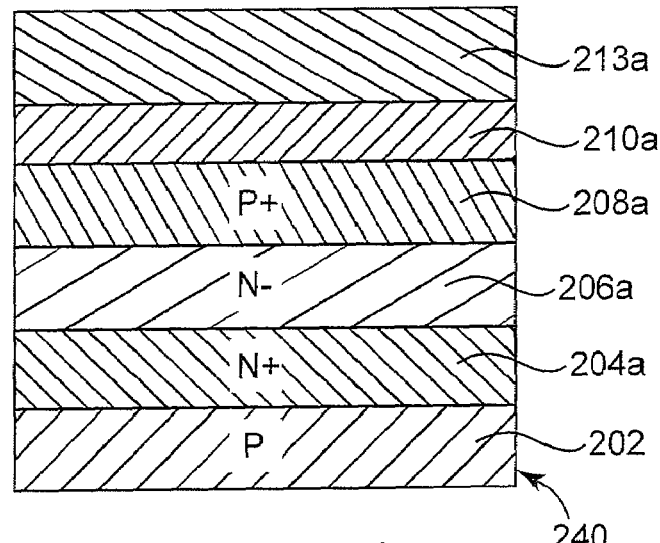
FIG. 10A illustrates a cross-sectional view of one embodiment of the wafer after depositing an electrode material layer.

FIG. 10A illustrates a cross-sectional view of one embodiment of wafer 240 after depositing an electrode material layer. An electrode material, such as TiN, TaN, W, Al, Ti, Ta, TiSiN, TaSiN, TiAlN, Cu, WN, C, or other suitable electrode material is deposited over silicide layer 210a to provide electrode material layer 213a. Electrode material layer 213a is deposited using chemical vapor deposition (CVD), high density plasma-chemical vapor deposition (HDP-CVD), atomic layer deposition (ALD), metal organic chemical vapor deposition (MOCVD), physical vapor deposition (PVD), jet vapor deposition (JVD), or other suitable deposition technique. Wafer 240 as illustrated in FIG. 10A is used to fabricate memory cell 200a previously described and illustrated with reference to FIG. 3 or memory cell 200b previously described and illustrated with reference to FIG. 4.

Figure 10B:
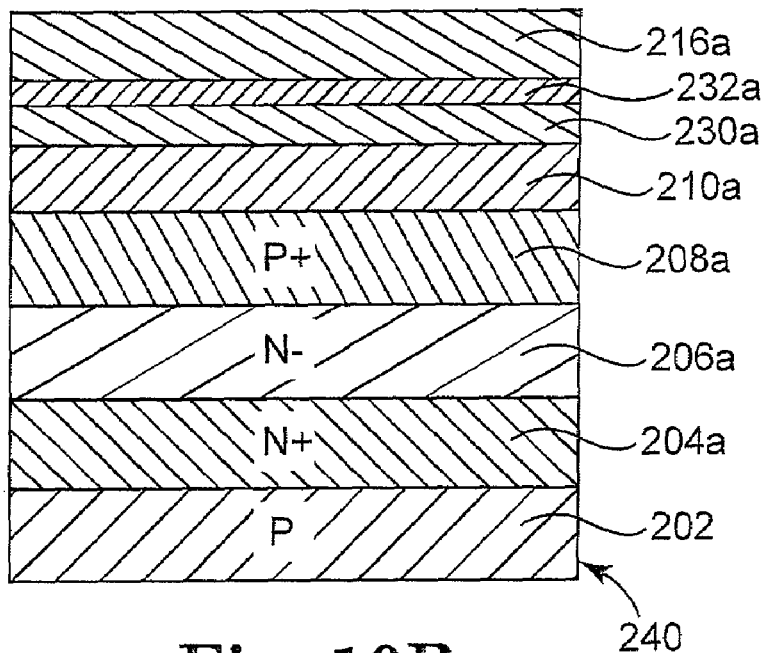
FIG. 10B illustrates a cross-sectional view of one embodiment of the wafer after depositing a first electrode material layer, an etch stop material layer, and a second electrode material layer.

FIG. 10B illustrates a cross-sectional view of one embodiment of wafer 240 after depositing a first electrode material layer 230a, an etch stop material layer 232a, and a second electrode material layer 216a. In one embodiment, wafer 240 illustrated in FIG. 10B is used in subsequent processing steps in place of wafer 240 illustrated in FIG. 10A to fabricate memory cell 200c previously described and illustrated with reference to FIG. 5.

An electrode material, such as TiN, TaN, W, Al, Ti, Ta, TiSiN, TaSiN, TiAlN, Cu, WN, C, or other suitable electrode material is deposited over silicide layer 210a to provide first electrode material layer 230a. First electrode material layer 230a is deposited using CVD, HDP-CVD, ALD, MOCVD, PVD, JVD, or other suitable deposition technique.

An etch stop material is deposited over first electrode material layer 230a to provide etch stop material layer 232a. Etch stop material layer 232a is deposited using CVD, HDP-CVD, ALD, MOCVD, PVD, JVD, or other suitable deposition technique.

The same electrode material that was deposited to provide first electrode material layer 230a is deposited over etch stop material layer 232a to provide second electrode material layer 216a. Second electrode material layer 216a is deposited using CVD, HDP-CVD, ALD, MOCVD, PVD, JVD, or other suitable deposition technique.

Figure 10C:
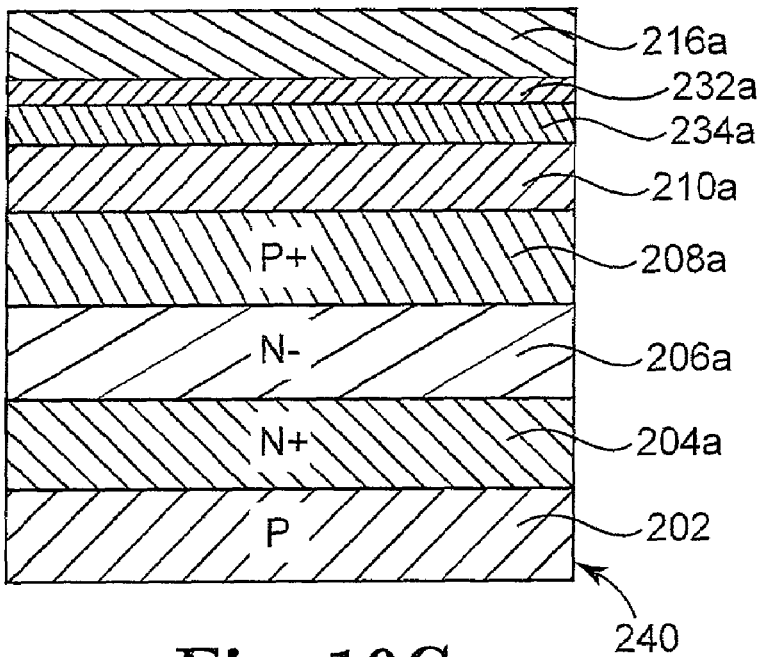
FIG. 10C illustrates a cross-sectional view of one embodiment of the wafer after depositing a first electrode material layer, an etch stop material layer, and a second electrode material layer.

FIG. 10C illustrates a cross-sectional view of one embodiment of wafer 240 after depositing a first electrode material layer 234a, an etch stop material layer 232a, and a second electrode material layer 216a. In one embodiment, wafer 240 illustrated in FIG. 10C is used in subsequent processing steps in place of wafer 240 illustrated in FIG. 10A to fabricate memory cell 200e previously described and illustrated with reference to FIG. 7.

An electrode material, such as TiN, TaN, W, Al, Ti, Ta, TiSiN, TaSiN, TiAlN, Cu, WN, C, or other suitable electrode material is deposited over silicide layer 210a to provide first electrode material layer 234a. First electrode material layer 234a is deposited using CVD, HDP-CVD, ALD, MOCVD, PVD, JVD, or other suitable deposition technique.

An etch stop material is deposited over first electrode material layer 234a to provide etch stop material layer 232a. Etch stop material layer 232a is deposited using CVD, HDP-CVD, ALD, MOCVD, PVD, JVD, or other suitable deposition technique.

An electrode material different than the electrode material deposited to provide first electrode material layer 234a, such as TiN, TaN, W, Al, Ti, Ta, TiSiN, TaSiN, TIAlN, Cu, WN, C, or other suitable electrode material is deposited over etch stop material layer 232a to provide second electrode material layer 216a. Second electrode material layer 216a is deposited using CVD, HDP-CVD, ALD, MOCVD, PVD, JVD, or other suitable deposition technique.

Figure 10D:
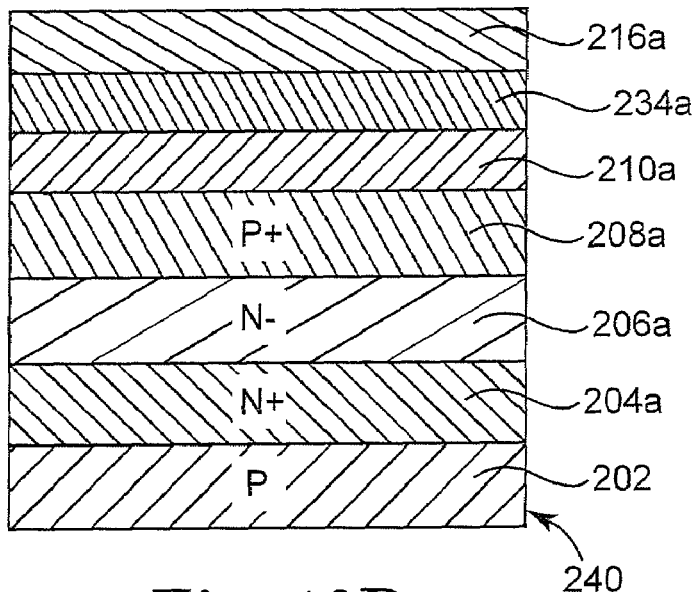
FIG. 10D illustrates a cross-sectional view of one embodiment of the wafer after depositing a first electrode material layer and a second electrode material layer.

FIG. 10D illustrates a cross-sectional view of one embodiment of wafer 240 after depositing a first electrode material layer 234a and a second electrode material layer 216a. In one embodiment, wafer 240 illustrated in FIG. 10D is used in subsequent processing steps in place of wafer 240 illustrated in FIG. 10A to fabricate memory cell 200d previously described and illustrated with reference to FIG. 6.

An electrode material, such as TiN, TaN, W, Al, Ti, Ta, TiSiN, TaSiN, TiAlN, Cu, WN, C, or suitable electrode material is deposited over silicide layer 210a to provide first electrode material layer 234a. First electrode material layer 234a is deposited using CVD, HDP-CVD, ALD, MOCVD, PVD, JVD, or other suitable deposition technique.

An electrode material different than the electrode material deposited to provide first electrode material layer 234a, such as TiN, TaN, W, Al, Ti, Ta, TiSiN, TaSiN, TiAlN, Cu, WN, C, or other suitable electrode material is deposited over first electrode material layer 234a to provide second electrode material layer 216a. Second electrode material layer 216a is deposited using CVD, HDP-CVD, ALD, MOCVD, PVD, JVD, or other suitable deposition technique.

While the following FIGS. 11-26 illustrate the fabrication process of memory cell 200a using wafer 240 illustrated in FIG. 10A, wafers 240 illustrated in FIGS. 10B-10D can be used in place of wafer 240 illustrated in FIG. 10A to fabricate memory cells 200c-200e using a similar fabrication process.

Figure 11:
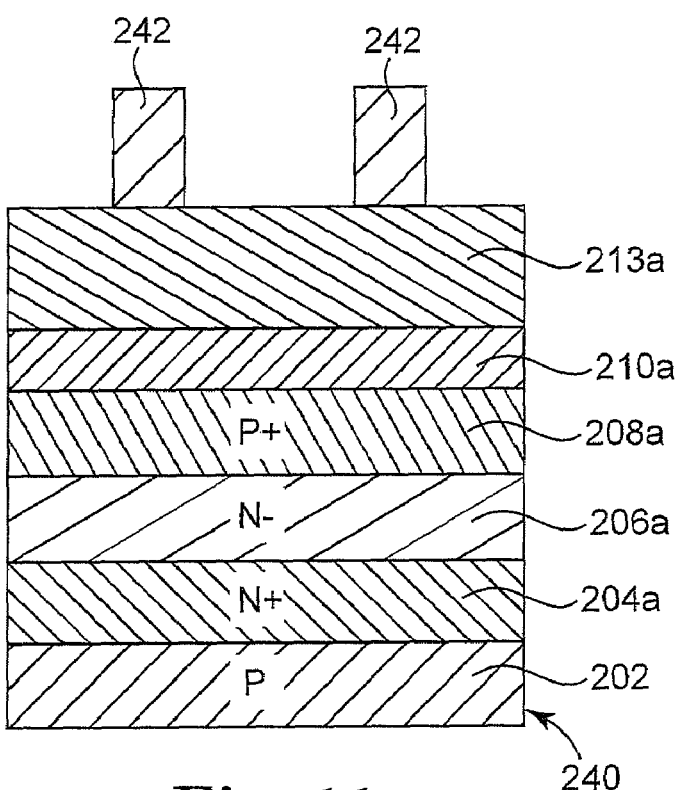
FIG. 11 illustrates a cross-sectional view of one embodiment of the wafer after forming a mask.

FIG. 11 illustrates a cross-sectional view of one embodiment of wafer 240 after forming a mask 242. A mask material or materials, such as photo resist, a hard mask material and photo resist, or other suitable mask material or materials are deposited over electrode material layer 213a to provide a mask material layer. The mask material layer is deposited using CVD, HDP-CVD, ALD, MOCVD, PVD, JVD, spin on, or other suitable deposition technique. Using line lithography, the mask material layer is patterned and etched to provide lines of mask material forming mask 242.

In one embodiment, where the mask material layer includes photo resist, the photo resist is trimmed after the line lithography process to reduce the cross-sectional width of the lines of mask material to a sublithographic width. In one embodiment, where a hard mask material and photo resist is used, the photo resist is stripped after forming the lines of mask material. In another embodiment, where the mask material layer includes a hard mask, the hard mask material is trimmed using a wet etch or other suitable etch after the line lithography process to reduce the cross-sectional width of the lines of mask material to a sublithographic width. In another embodiment, where the mask layer includes a hard mask material and photo resist, a photo resist trim and etching of the hard mask material is performed after the line lithography process to reduce the cross-sectional width of the lines of mask material to a sublithographic width.

Figure 12:
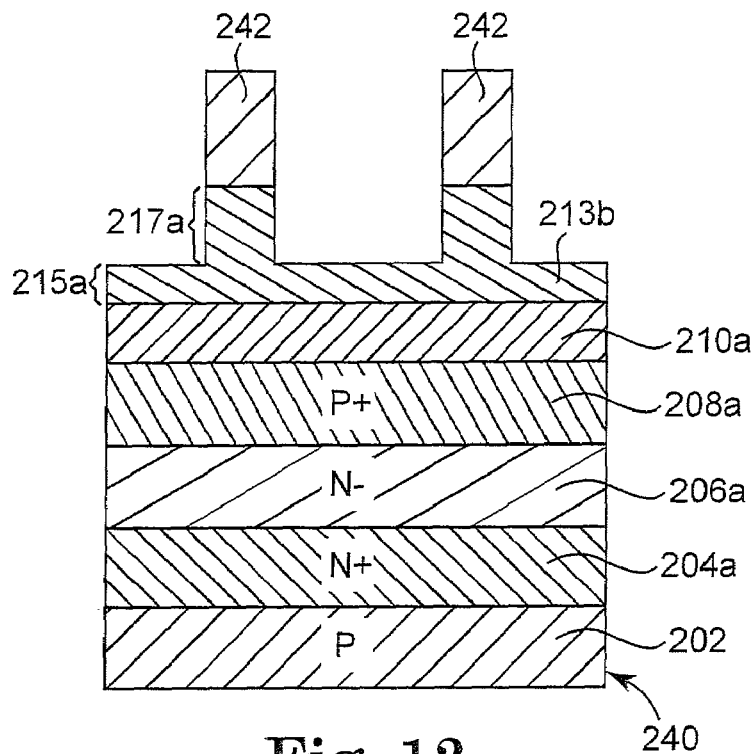
FIG. 12 illustrates a cross-sectional view of one embodiment of the wafer after etching the electrode material layer.

FIG. 12 illustrates a cross-sectional view of one embodiment of wafer 240 after etching electrode material layer 213a. The exposed portions of electrode material layer 213a are partially etched to provide electrode material layer 213b. Electrode material layer 213b includes a first portion 215a and a second portion 217a. Second portion 217a provides lines of electrode material. First portion 215a covers silicide layer 210a.

In one embodiment, electrode material layer 213a is etched to expose portions of silicide layer 210a for fabricating memory cell 200b previously described and illustrated with reference to FIG. 4. In another embodiment, where wafer 240 illustrated in FIG. 10B or FIG. 10C is used in place of wafer 240 illustrated in FIG. 10A, the etch stops on etch stop material layer 232a. In another embodiment, where wafer 240 illustrated in FIG. 10D is used in place of wafer 240 illustrated in FIG. 10A, the etch stops on electrode material layer 234a.

Figure 13:
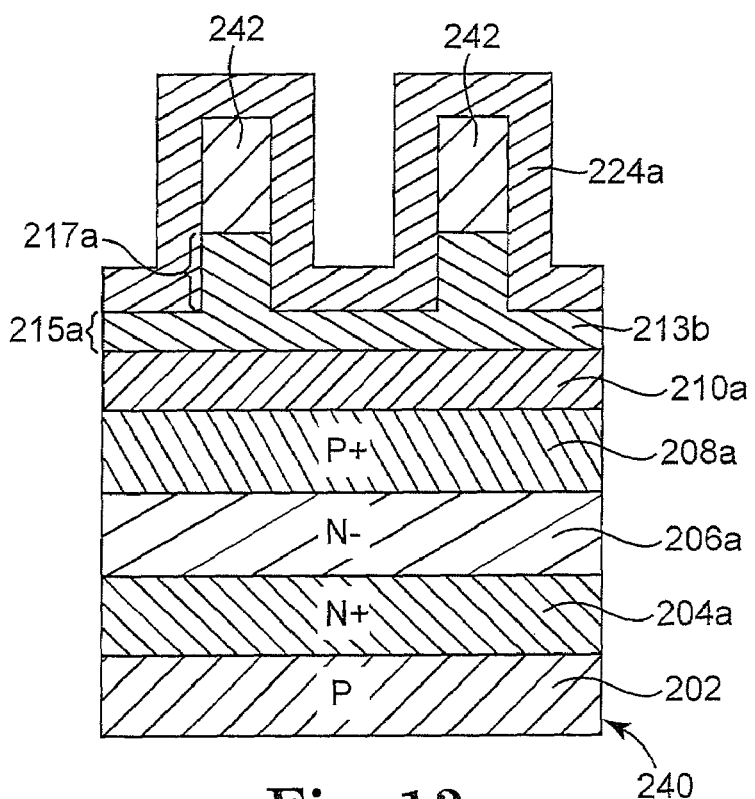
FIG. 13 illustrates a cross-sectional view of one embodiment of the wafer after depositing a spacer material layer.

FIG. 13 illustrates a cross-sectional view of one embodiment of wafer 240 after depositing a spacer material layer 224a. A spacer material, such as SiN, SiO$_2$, SiO$_x$N, or other suitable spacer material is conformally deposited over exposed portions of mask 242 and electrode material layer 213b to provide spacer material layer 224a. Spacer material layer 224a is deposited using CVD, HDP-CVD, ALD, MOCVD, PVD, JVD, or other suitable deposition technique.

Figure 14:
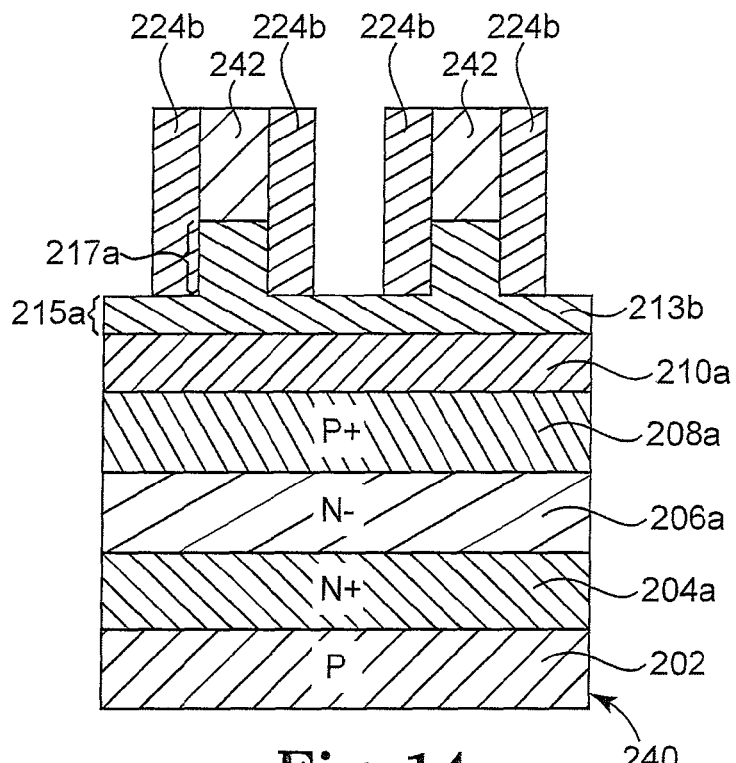
FIG. 14 illustrates a cross-sectional view of one embodiment of the wafer after etching the spacer material layer.

FIG. 14 illustrates a cross-sectional view of one embodiment of wafer 240 after etching spacer material layer 224a. Spacer material layer 224a is spacer etched to expose the top of mask layer 242 and portions of electrode material layer 213b to provide spacers 224b. Spacers 224b contact the sidewalls of the lines of electrode material 217a.

Figure 15:
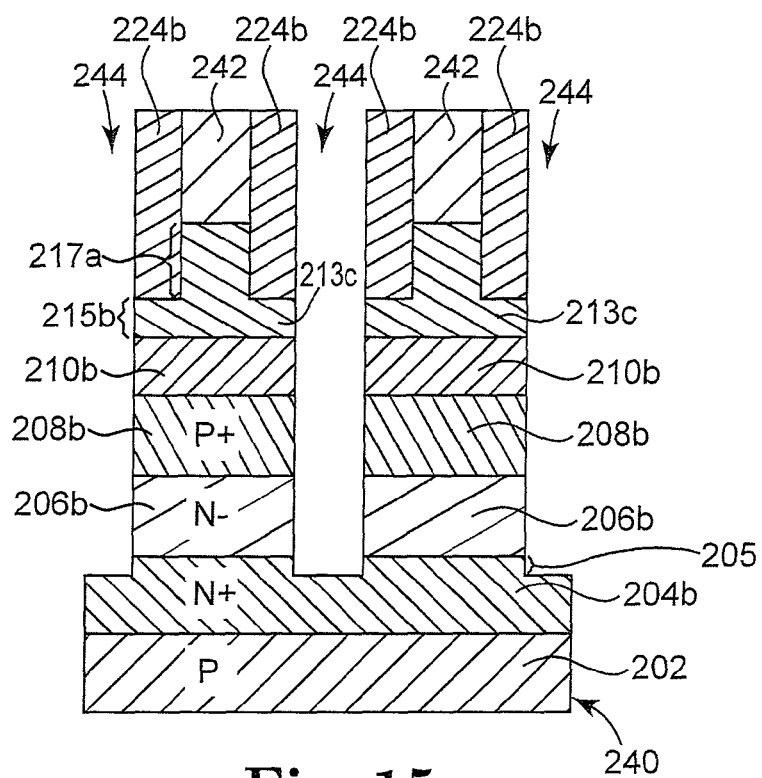
FIG. 15 illustrates a cross-sectional view of one embodiment of the wafer after etching trenches.

FIG. 15 illustrates a cross-sectional view of one embodiment of wafer 240 after etching trenches 244. Electrode material layer 213b, silicide layer 210a, P+ region layer 208a, N− region layer 206b, and an optional portion 205 of N+ region 204a are etched self-aligned to spacers 224b to provide trenches 244 and lines of electrode material 213c, silicide lines 210b, P+ region lines 208b, N− region lines 206b, and N+ region 204b.

Figure 16:
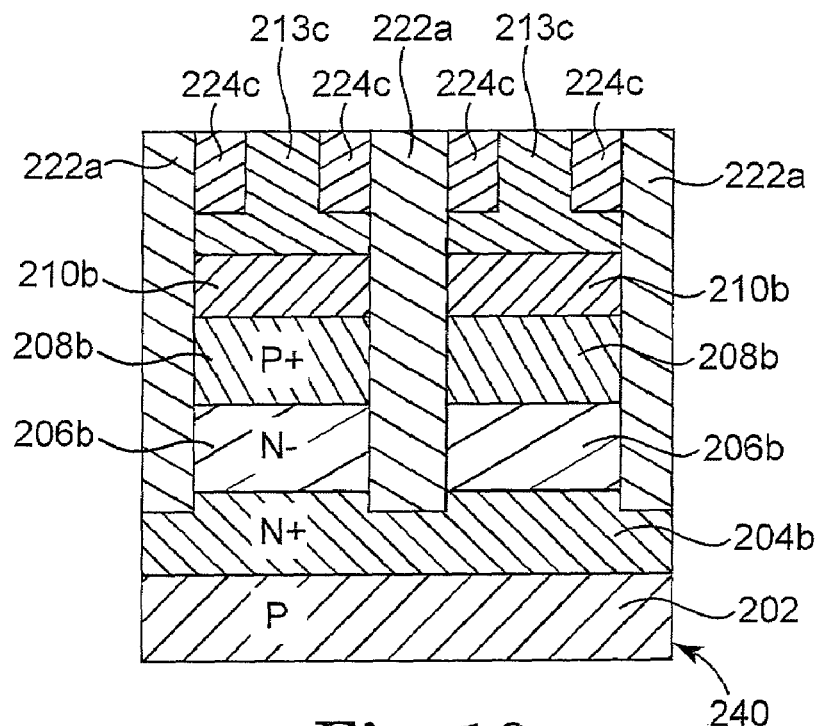
FIG. 16 illustrates a cross-sectional view of one embodiment of the wafer after depositing dielectric material into the trenches.

FIG. 16 illustrates a cross-sectional view of one embodiment of wafer 240 after depositing dielectric material 222a into trenches 244. A dielectric material, such as SiO$_2$, SiO$_x$, SiN, FSG, BPSG, BSG, or other suitable dielectric material is deposited over exposed portions of mask 242, spacers 224b, lines of electrode material 213c, silicide lines 210b, P+ region lines 208b, N− region lines 206b, and N+ region 204b to provide a dielectric material layer. The dielectric material layer, mask 242, and spacers 224b are then planarized to remove mask 242, to expose lines of electrode material 213c, and to provide spacers 224c and dielectric material 222a. The dielectric material layer is planarized using chemical mechanical planarization (CMP) or another suitable planarization technique. In one embodiment, mask 242 is removed before depositing and planarizing the dielectric material layer.

Figure 17:
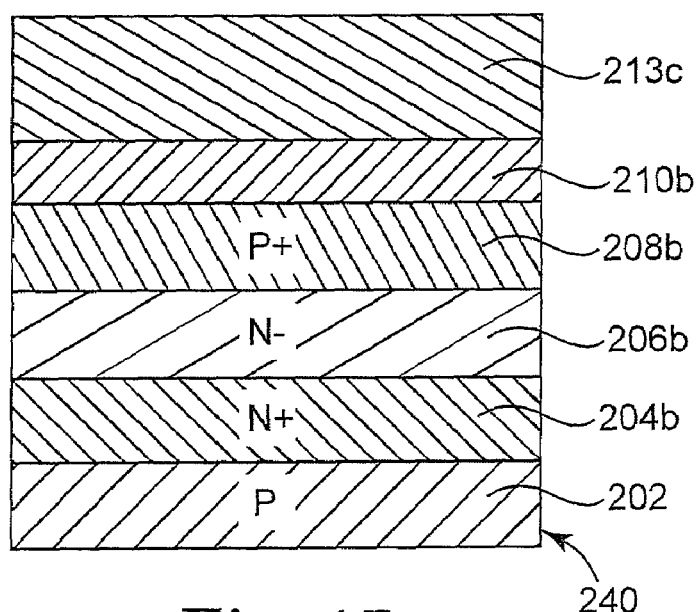
FIG. 17 illustrates a cross-sectional view of one embodiment of the wafer perpendicular to the cross-sectional view illustrated in FIG. 16.

FIG. 17 illustrates a cross-sectional view of one embodiment of wafer 240 perpendicular to the cross-sectional view illustrated in FIG. 16. The cross-sectional view of FIG. 17 is taken along a line of electrode material 213c. The cross-sectional view also includes a silicide line 210b, a P+ region line 208b, an N− region line 206b, and N+ region 204b. The following FIGS. 18-23 illustrate the same cross-sectional view as illustrated in FIG. 17.

Figure 18:
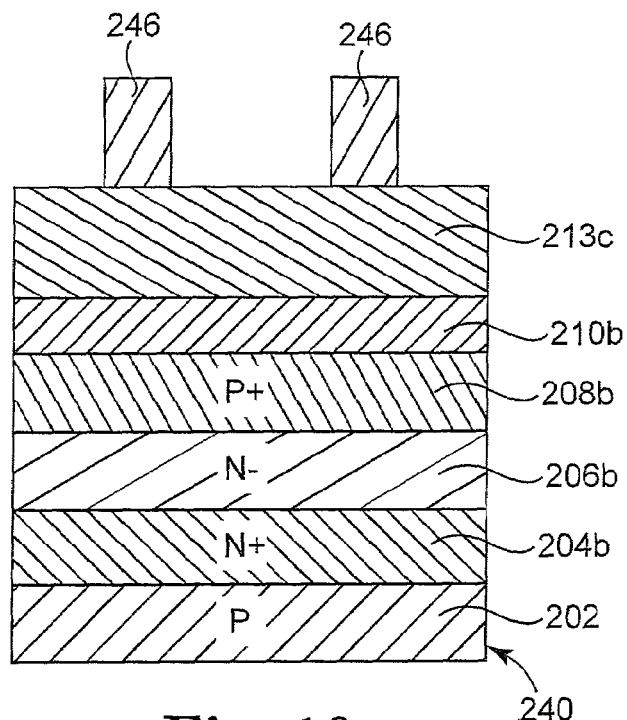
FIG. 18 illustrates a cross-sectional view of one embodiment of the wafer after forming a mask.

FIG. 18 illustrates a cross-sectional view of one embodiment of wafer 240 after forming a mask 246. A mask material or materials, such as photo resist, a hard mask material and photo resist, or other suitable mask material or materials are deposited over lines of electrode material 213c, spacers 224c, and dielectric material 222a to provide a mask material layer. The mask material layer is deposited using CVD, HDP-CVD, ALD, MOCVD, PVD, JVD, spin on, or other suitable deposition technique. Using line lithography, the mask material layer is patterned and etched to provide lines of mask material forming mask 246. The lines of mask material are perpendicular to the lines of electrode material 213c.

In one embodiment, the mask material layer includes a lithographically defined photo resist layer. In another embodiment, where the mask material layer includes photo resist, the photo resist is trimmed after the line lithography process to reduce the cross-sectional width of the lines of mask material to a sublithographic width. In one embodiment, where a hard mask material and photo resist is used, the photo resist is stripped after forming the lines of mask material. In another embodiment, where the mask material layer includes a hard mask, the hard mask material is trimmed using a wet etch or other suitable etch after the line lithography process to reduce the cross-sectional width of the lines of mask material to a sublithographic width. In another embodiment, where the mask layer includes a hard mask material and photo resist, a photo resist trim and etching of the hard mask material is performed after the line lithography process to reduce the cross-sectional width of the lines of mask material to a sublithographic width.

Figure 19:
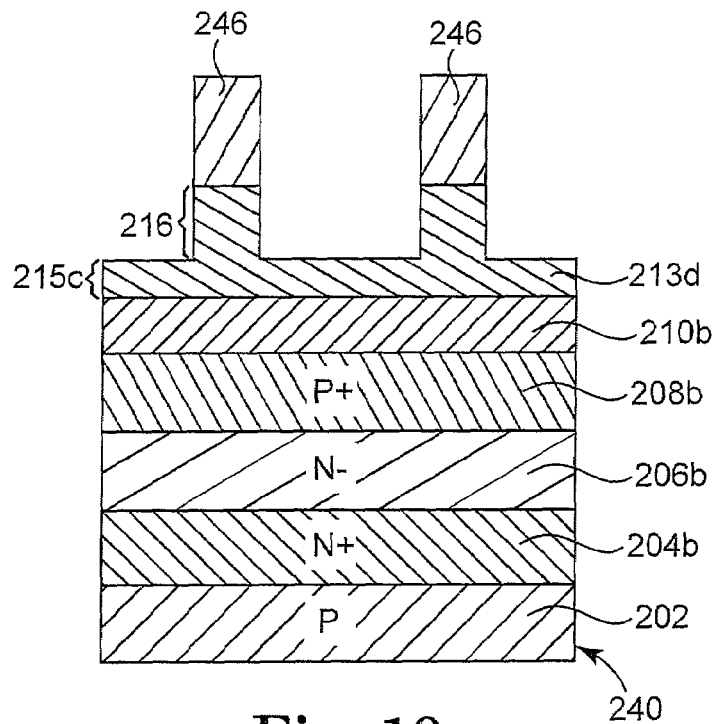
FIG. 19 illustrates a cross-sectional view of one embodiment of the wafer after etching the lines of electrode material.

FIG. 19 illustrates a cross-sectional view of one embodiment of wafer 240 after etching the lines of electrode material 213c. The exposed portions of the lines of electrode material 213c are etched to provide electrode material 213d. Electrode material 213d includes a first portion 215c and second portions 216.

In one embodiment, the lines of electrode material 213c are etched to expose portions of silicide layer 210b for fabricating memory cell 200b previously described and illustrated with reference to FIG. 4. In another embodiment, where wafer 240 illustrated in FIG. 10B or FIG. 10C is used in place of wafer 240 illustrated in FIG. 10A, the etch stops on etch stop material layer 232a. In another embodiment, where wafer 240 illustrated in FIG. 10D is used in place of wafer 240 illustrated in FIG. 10A, the etch stops on electrode material layer 234a.

Figure 20:
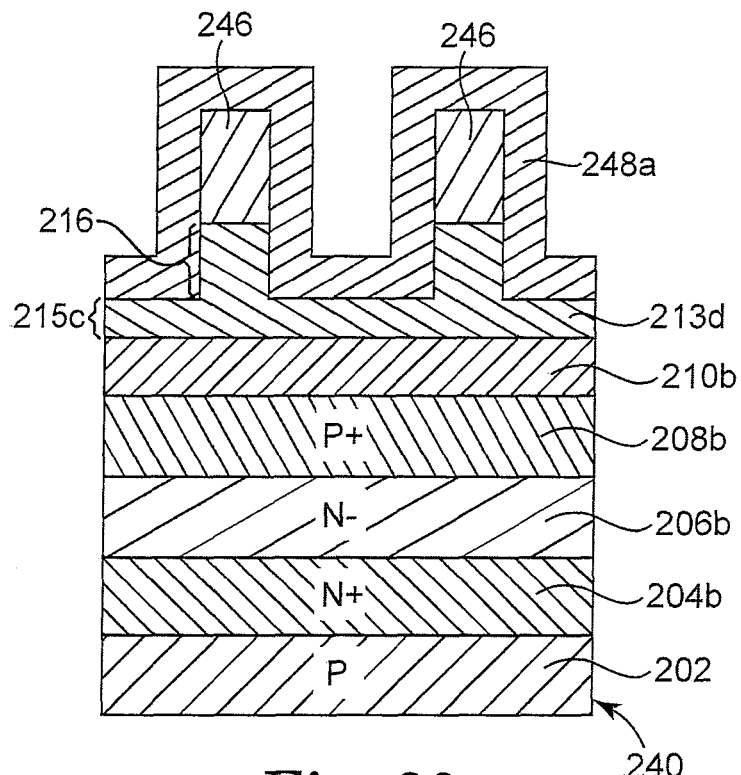
FIG. 20 illustrates a cross-sectional view of one embodiment of the wafer after depositing a spacer material layer.

FIG. 20 illustrates a cross-sectional view of one embodiment of wafer 240 after depositing a spacer material layer 248a. A spacer material, such as SiN, $SiO_2$, $SiO_xN$, or other suitable spacer material is conformally deposited over exposed portions of mask 246 and electrode material 213d to provide spacer material layer 248a. Spacer material layer 248a is deposited using CVD, HDP-CVD, ALD, MOCVD, PVD, JVD, or other suitable deposition technique.

Figure 21:
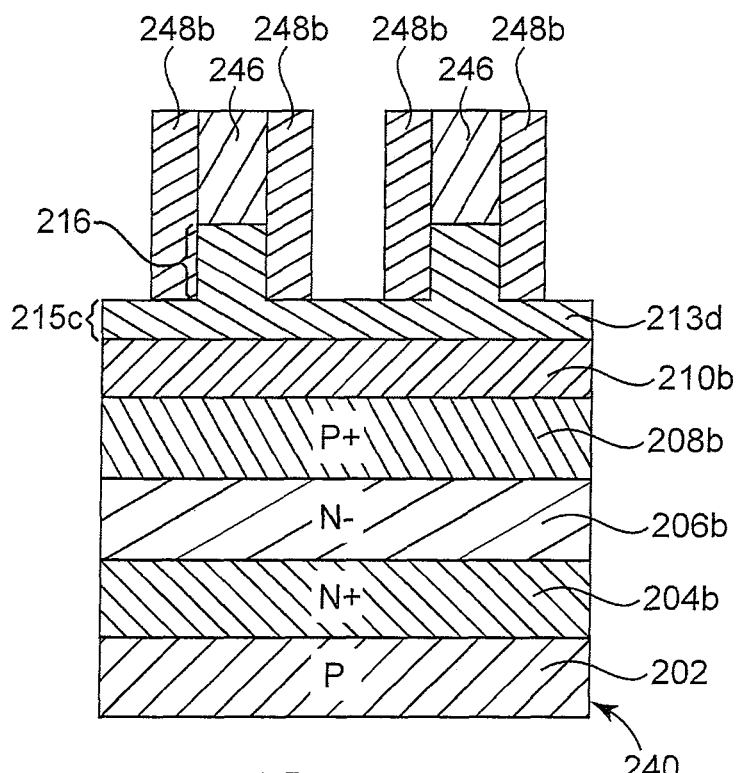
FIG. 21 illustrates a cross-sectional view of one embodiment of the wafer after etching the spacer material layer.

FIG. 21 illustrates a cross-sectional view of one embodiment of wafer 240 after etching spacer material layer 248a. Spacer material layer 248a is spacer etched to expose the top of mask 246 and portions of electrode material 213d to provide spacers 248b. Spacers 248b contact sidewalls of second portions 216 of electrode material 213d. In one embodiment, the steps for forming spacers 248b as illustrated and described with reference to FIGS. 20 and 21 are skipped and the fabrication process continues without spacers 248b.

Figure 22:
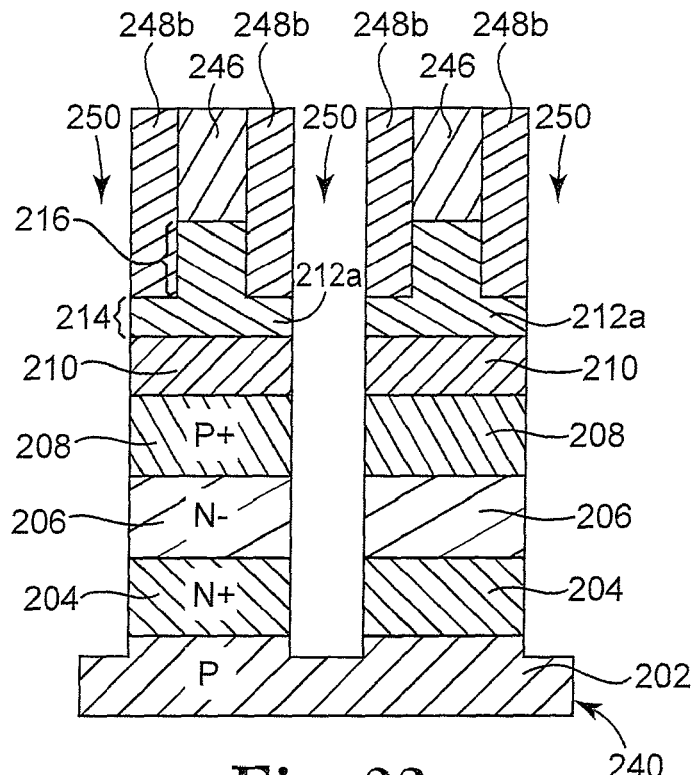
FIG. 22 illustrates a cross-sectional view of one embodiment of the wafer after etching trenches.

FIG. 22 illustrates a cross-sectional view of one embodiment of wafer 240 after etching trenches 250. Electrode material 213d, silicide lines 210b, P+ region lines 208b, N− region lines 206b, and N+ region 204b are etched self-aligned to spacers 248b to provide trenches 250 and bottom electrodes 212a, silicide contacts 210, P+ regions 208, N− regions 206, and N+ word lines 204. In one embodiment, trenches 250 extend into P substrate 202 to ensure word line separation.

Figure 23:
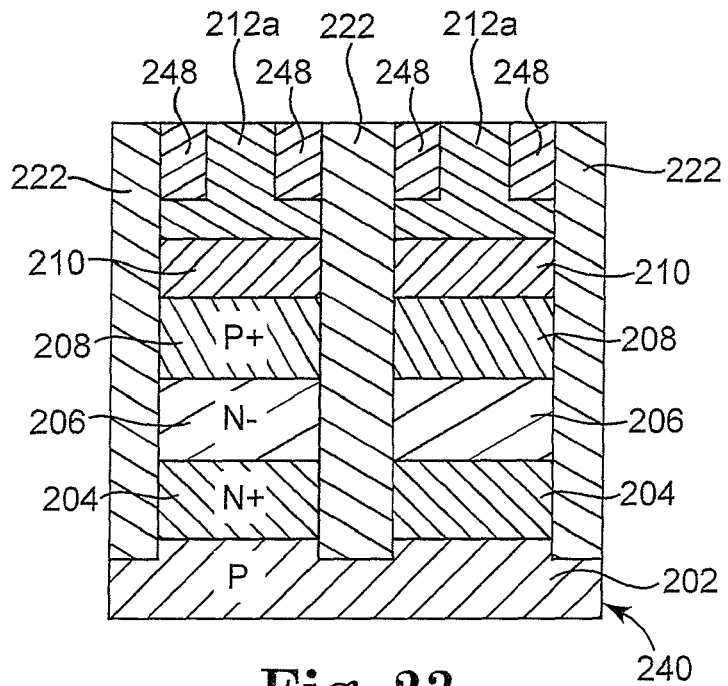
FIG. 23 illustrates a cross-sectional view of one embodiment of the wafer after depositing dielectric material into the trenches.

FIG. 23 illustrates a cross-sectional view of one embodiment of wafer 240 after depositing dielectric material 222 into trenches 250. A dielectric material, such as $SiO_2$, $SiO_x$, SiN, FSG, BPSG, BSG, or other suitable dielectric material is deposited over exposed portions of mask 246, spacers 248b, bottom electrodes 212a, silicide contacts 210, P+ regions 208, N− regions 206, N+ word lines 204, and P substrate 202 to provide a dielectric material layer. The dielectric material layer, mask 246, and spacers 248b are then planarized to remove mask 246, to expose bottom electrodes 212a, and to provide spacers 248 and dielectric material 222. The dielectric material layer is planarized using CMP or another suitable planarization technique. In one embodiment, mask 246 is removed before depositing and planarizing the dielectric material layer.

Figure 24:
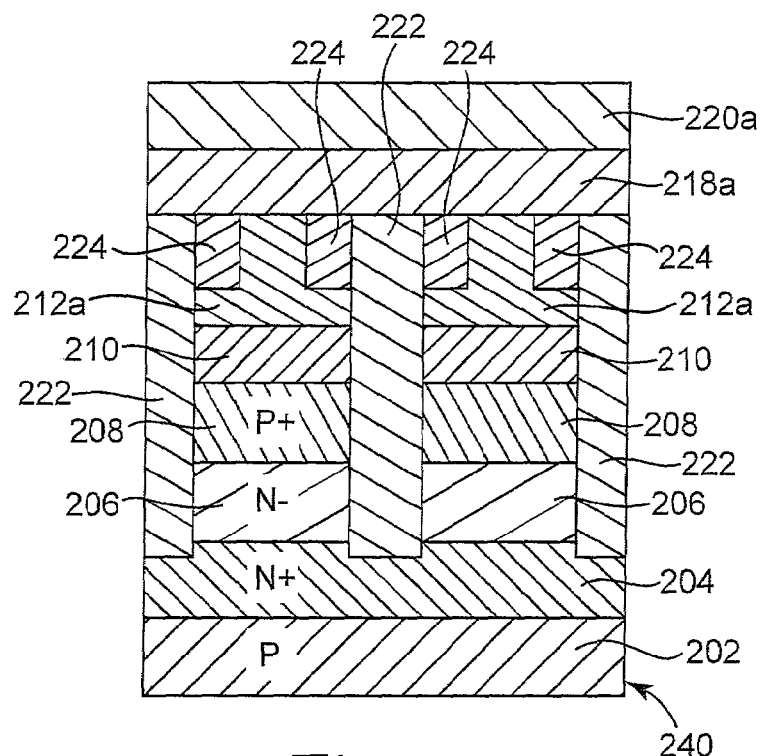
FIG. 24 illustrates a cross-sectional view of one embodiment of the wafer after depositing a phase change material layer and an electrode material layer.

FIG. 24 illustrates a cross-sectional view of one embodiment of wafer 240 after depositing a phase change material layer 218a and an electrode material layer 220a. The cross-sectional view illustrated in FIG. 24 is perpendicular to the cross-sectional view illustrated in FIG. 23. A phase change material, such as a chalcogenide compound material or other suitable phase change material is deposited over exposed portions of dielectric material 222, spacers 224, and bottom electrodes 212a to provide phase change material layer 218a. Phase change material layer 218a is deposited using CVD, HDP-CVD, ALD, MOCVD, PVD, JVD, or other suitable deposition technique.

An electrode material, such as TiN, TaN, W, Al, Ti, Ta, TiSiN, TaSiN, TiAlN, TaAlN, Cu, WN, C, or suitable electrode material is deposited over phase change material layer 218a to provide electrode material layer 220a. Electrode material layer 220a is deposited using CVD, HDP-CVD, ALD, MOCVD, PVD, JVD, or other suitable deposition technique.

Figure 25:
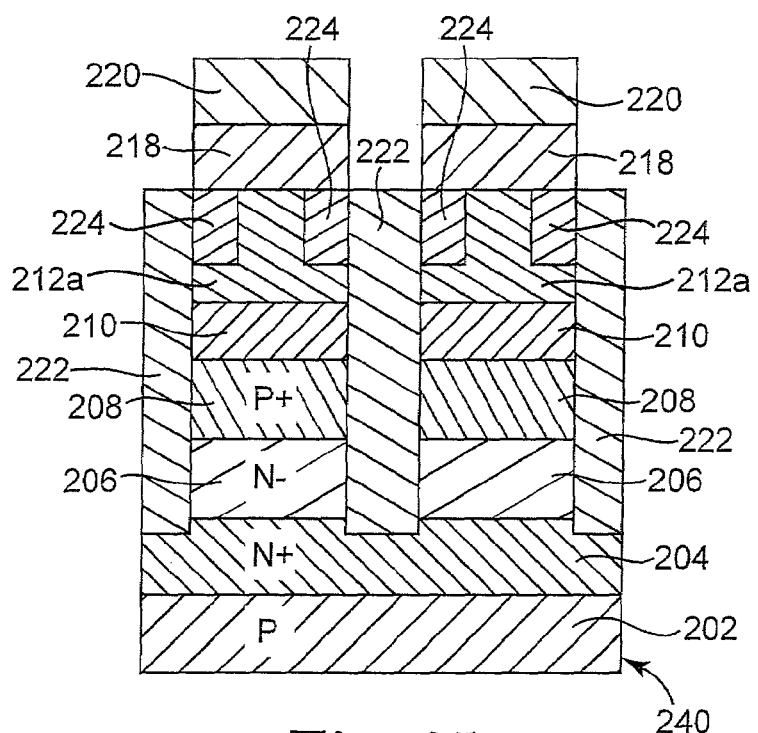
FIG. 25 illustrates a cross-sectional view of one embodiment of the wafer after etching the electrode material layer and the phase change material layer.

FIG. 25 illustrates a cross-sectional view of one embodiment of wafer 240 after etching electrode material layer 220a and phase change material layer 218a. Electrode material layer 220a and phase change material layer 218a are etched to expose portions of dielectric material 222 and to provide phase change elements 218 and top electrodes 220. In one embodiment, phase change material layer 218a and electrode material layer 220a are etched in lines to form phase change elements 218 and top electrodes 220. In one embodiment, each line extends across the entire array of memory cells. In another embodiment, a number of shorter lines within each row of memory cells extend across the array of memory cells. In another embodiment, phase change material layer 218a and electrode material layer 220a are etched to form pillars above each bottom electrode 212a to provide phase change elements 218 and top electrodes 220.

In another embodiment, phase change elements 218 are fabricated by first depositing a dielectric material, such as $SiO_2$, $SiO_x$, SiN, FSG, BPSG, BSG, or other suitable dielectric material over bottom electrodes 212a, spacers 224, and dielectric material 222 to provide a dielectric material layer. The dielectric material layer is deposited using CVD, HDP-CVD, ALD, MOCVD, PVD, JVD, or other suitable deposition technique. The dielectric material layer is then etched to provide openings exposing bottom electrodes 212a. A phase change material, such as a chalcogenide compound material or other suitable phase change material is deposited over the etched dielectric material layer and bottom electrodes 212a to provide a phase change material layer. The phase change material layer is deposited using CVD, HDP-CVD, ALD, MOCVD, PVD, JVD, or other suitable deposition technique. The phase change material layer is then planarized using CMP or another suitable planarization technique to expose the etched dielectric material layer and to provide phase change elements 218.

Figure 26:
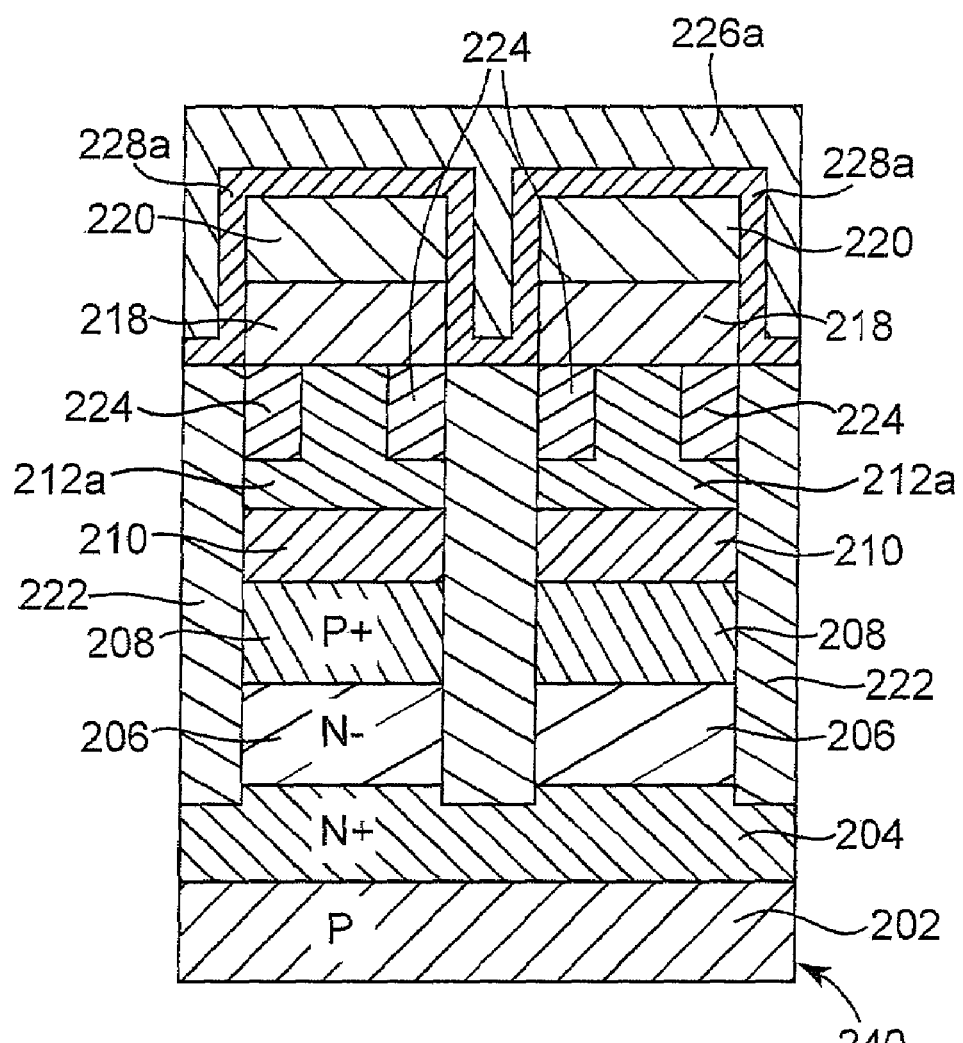
FIG. 26 illustrates a cross-sectional view of one embodiment of the wafer after depositing an encapsulation material layer and a dielectric material layer.

FIG. 26 illustrates a cross-sectional view of one embodiment of wafer 240 after depositing an encapsulation material layer 228a and a dielectric material layer 226a. Encapsulation material is deposited over exposed portions of top electrodes 220, phase change elements 218, and dielectric material 222 to provide encapsulation material layer 228a. Encapsulation material layer 228a is deposited using CVD, HDP-CVD, ALD, MOCVD, PVD, JVD, or other suitable deposition technique. In one embodiment, more than one encapsulation material layer is deposited over top electrodes 220 and phase change elements 218.

A dielectric material, such as $SiO_2$, $SiO_x$, SiN, FSG, BPSG, BSG, or other suitable dielectric material is deposited over encapsulation material 228a to provide dielectric material layer 226a. Dielectric material layer 226a is deposited using CVD, HDP-CVD, ALD, MOCVD, PVD, JVD, or other suitable deposition technique.

Dielectric material layer 226a and encapsulation material layer 228a are etched to provide openings exposing top electrodes 220. A contact material is deposited into the openings. Upper metallization layers are then fabricated, including bit lines 112 coupled to top electrodes 220 through the contacts. In one embodiment, bit lines 112 are formed perpendicular to word lines 204.

Embodiments provide a resistive memory including resistivity changing memory elements accessed by vertical diodes. The memory cells are formed using a crossed line lithography fabrication process. The fabrication process includes forming the vertical diodes using a self-aligned process. In this way, a $4F^2$ memory cell can be fabricated.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
a vertical diode;
a silicide contact contacting the vertical diode;
a first electrode coupled to the silicide contact;
a spacer having a first sidewall contacting a first sidewall of the first electrode;
a resistivity changing material coupled to the first electrode; and
a second electrode coupled to the resistivity changing material,
wherein a second sidewall of the spacer is aligned on a line with a sidewall of the vertical diode and a second sidewall of the first electrode.

2. The integrated circuit of claim 1, wherein the first electrode comprises an etch stop material layer contacting the spacer.

3. The integrated circuit of claim 1, wherein the first electrode comprises a first electrode material contacting the silicide contact and a second electrode material contacting the resistivity changing material.

4. The integrated circuit of claim 1, further comprising:
an N+ word line coupled to the diode.

5. The integrated circuit of claim 1, wherein the resistivity changing material comprises phase change material.

6. The integrated circuit of claim 1, further comprising:
at least one encapsulation material layer encapsulating the resistivity changing material and the second electrode.

7. An integrated circuit comprising:
a vertical diode including a first polarity region and a second polarity region;
a silicide contact contacting the second polarity region;
a first electrode coupled to the silicide contact;
a spacer having a first sidewall contacting a first sidewall of the first electrode;
a phase change element coupled to the first electrode; and
a second electrode coupled to the phase change element,
wherein a second sidewall of the spacer is aligned on a line with a second sidewall of the first electrode and a sidewall of the vertical diode.

8. The integrated circuit of claim 7, further comprising:
a word line contacting the first polarity region; and
a bit line coupled to the second electrode.

9. An integrated circuit comprising:
a first polarity region;
a second polarity region contacting the first polarity region;
a silicide contact contacting the second polarity region;
a first electrode coupled to the silicide contact;
a spacer having a first sidewall contacting a first sidewall of the first electrode;
a resistive memory element coupled to the first electrode; and
a second electrode coupled to the resistive memory element,
wherein a second sidewall of the spacer is aligned on a line with a second sidewall of the first electrode, a sidewall of the silicide contact, a sidewall of the second polarity region, and a sidewall of the first polarity region.

10. The integrated circuit of claim 9, wherein the first electrode comprises an etch stop material layer contacting the spacer.

11. The integrated circuit of claim 9, wherein the first electrode comprises a first electrode material contacting the silicide contact and a second electrode material contacting the resistive memory element.

12. The integrated circuit of claim 9, wherein the first polarity region comprises an N− region, and
wherein the second polarity region comprises a P+ region.

13. The integrated circuit of claim 9, further comprising:
an N+ word line contacting the N− region, the N+ word line having a sidewall self-aligned with the second sidewall of the spacer.

14. The integrated circuit of claim 9, further comprising:
at least one encapsulation material layer encapsulating the resistive memory element and the second electrode.

15. The integrated circuit of claim 9, wherein the resistive memory element comprises a phase change element.

16. An integrated circuit comprising:
a vertical diode;
a silicide contact contacting the vertical diode;
a first electrode coupled to the silicide contact, the first electrode having a first sidewall aligned in a line with a first sidewall of the silicide contact; and the first electrode having a second sidewall aligned in a line with a second sidewall of the silicide contact;
a spacer having a first sidewall contacting a third sidewall of the first electrode;
a resistivity changing material coupled to the first electrode; and
a second electrode coupled to the resistivity changing material,
wherein a second sidewall of the spacer is aligned on a line with a sidewall of the vertical diode and the second sidewall of the first electrode.

17. The integrated circuit of claim 16, wherein the first electrode comprises an etch stop material layer contacting the spacer, the etch stop material layer having a first sidewall aligned in a line with the first sidewall of the silicide contact, and the etch stop material layer having a second sidewall aligned in a line with the second sidewall of the silicide contact.

18. The integrated circuit of claim 16, wherein the first electrode comprises a first electrode material contacting the silicide contact and a second electrode material contacting the resistivity changing material.

19. The integrated circuit of claim 16, further comprising:
an N+ word line coupled to the diode.

20. The integrated circuit of claim 16, wherein the resistivity changing material comprises phase change material.

21. The integrated circuit of claim 16, further comprising:
at least one encapsulation material layer encapsulating the resistivity changing material and the second electrode; and
a dielectric material laterally surrounding the encapsulation material layer.

22. The integrated circuit of claim 16, further comprising:
a dielectric material laterally surrounding the vertical diode, the silicide contact, the first electrode, and the spacer.

* * * * *